(12) United States Patent
Taneda et al.

(10) Patent No.: US 10,115,779 B2
(45) Date of Patent: *Oct. 30, 2018

(54) DISPLAY UNIT

(71) Applicant: Sony Corporation, Tokyo (JP)

(72) Inventors: Takayuki Taneda, Aichi (JP); Tetsuro Yamamoto, Kanagawa (JP); Katsuhide Uchino, Kanagawa (JP)

(73) Assignee: Sony Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/617,275

(22) Filed: Jun. 8, 2017

(65) Prior Publication Data
US 2017/0271425 A1    Sep. 21, 2017

Related U.S. Application Data

(63) Continuation of application No. 15/172,899, filed on Jun. 3, 2016, now Pat. No. 9,711,581, which is a (Continued)

(30) Foreign Application Priority Data

Mar. 13, 2009 (JP) .............................. P2009-061713

(51) Int. Cl.
*H01L 27/32* (2006.01)
*G09G 3/3233* (2016.01)

(52) U.S. Cl.
CPC ....... *H01L 27/3262* (2013.01); *G09G 3/3233* (2013.01); *H01L 27/3206* (2013.01);
(Continued)

(58) Field of Classification Search
None
See application file for complete search history.

(56) References Cited

U.S. PATENT DOCUMENTS 7,038,240 B2    5/2006    Matsumoto
7,675,232 B2    3/2010    Kawachi et al.
(Continued)

FOREIGN PATENT DOCUMENTS

CN    1497513 A    5/2004
CN    101017844 A    8/2007
(Continued)

OTHER PUBLICATIONS

European Search Report EP 10155562, dated Oct. 26, 2012.
(Continued)

*Primary Examiner* — Khaja Ahmad
(74) *Attorney, Agent, or Firm* — Lerner, David, Littenberg, Krumholz & Mentlik, LLP

(57) ABSTRACT

A display unit with which lowering of long-term reliability of a transistor is decreased is provided. The display unit includes a display section having a plurality of organic EL devices with light emitting color different from each other and a plurality of pixel circuits that are singly provided for every said organic EL device for every pixel. The pixel circuit has a first transistor for writing a video signal, a second transistor for driving the organic EL device based on the video signal written by the first transistor, and a retentive capacity, and out of the first transistor and the second transistor, a third transistor provided correspondingly to a second organic EL device adjacent to a first organic EL device is arranged farther from the first organic EL device than a first retentive capacity provided correspondingly to the second organic EL device out of the retentive capacity.

9 Claims, 16 Drawing Sheets

Related U.S. Application Data continuation of application No. 14/945,794, filed on Nov. 19, 2015, now Pat. No. 9,385,173, which is a continuation of application No. 14/616,941, filed on Feb. 9, 2015, now Pat. No. 9,287,331, which is a continuation of application No. 14/454,211, filed on Aug. 7, 2014, now Pat. No. 9,059,122, which is a continuation of application No. 14/197,778, filed on Mar. 5, 2014, now Pat. No. 8,841,672, which is a continuation of application No. 14/066,106, filed on Oct. 29, 2013, now Pat. No. 8,742,419, which is a continuation of application No. 12/660,846, filed on Mar. 5, 2010, now Pat. No. 8,610,122.

(52) U.S. Cl.
CPC ...... *H01L 27/3211* (2013.01); *H01L 27/3244* (2013.01); *H01L 27/3265* (2013.01); *G09G 2300/0452* (2013.01); *G09G 2300/0809* (2013.01); *H01L 27/3276* (2013.01)

(56) References Cited

U.S. PATENT DOCUMENTS

| | | | |
|---|---|---|---|
| 2004/0070808 A1 | 4/2004 | Nakanishi | |
| 2004/0113544 A1 | 6/2004 | Murakami et al. | |
| 2005/0051817 A1 | 3/2005 | Morita et al. | |
| 2005/0073487 A1* | 4/2005 | Matsumoto | H01L 27/3276 345/76 |
| 2005/0100832 A1 | 5/2005 | Adachi | |
| 2005/0139922 A1 | 6/2005 | Kim et al. | |
| 2008/0029768 A1 | 2/2008 | Asano et al. | |
| 2008/0062112 A1 | 3/2008 | Umezaki | |
| 2008/0290807 A1 | 11/2008 | Matsueda et al. | |
| 2009/0127559 A1 | 5/2009 | Morita et al. | |
| 2009/0128027 A1 | 5/2009 | Sagawa et al. | |
| 2009/0242884 A1 | 10/2009 | Sagawa et al. | |
| 2009/0315814 A1 | 12/2009 | Tomida et al. | |
| 2010/0133990 A1 | 6/2010 | Park et al. | |

FOREIGN PATENT DOCUMENTS

| | | |
|---|---|---|
| CN | 101017845 A | 8/2007 |
| CN | 101135791 A | 3/2008 |
| CN | 101609646 A | 12/2009 |
| EP | 1367647 A2 | 12/2003 |
| JP | 2002108250 A | 4/2002 |
| JP | 2007066862 A | 3/2007 |
| JP | 2008-083272 A | 4/2008 |
| KR | 20040031591 A | 4/2004 |
| KR | 100639010 B1 | 10/2006 |
| KR | 20080102955 A | 11/2008 |

OTHER PUBLICATIONS

Office Action from Japanese Application No. 2009-061713, dated Jun. 13, 2013.
Korean Office Action for KR Application No. 10-2010-19774, dated Jan. 6, 2015.
Chinese Office Action for CN Application No. 2013100589524, dated Feb. 2, 2015.
Chinese Office Action for CN Application No. 201510732460, dated Nov. 1, 2017.
Chinese Office Action for CN Application No. 201507324608, dated May 4, 2018.

\* cited by examiner

DISPLAY UNIT

CROSS-REFERENCE TO RELATED APPLICATION

The present application is a continuation of U.S. patent application Ser. No. 15/172,899, filed Jun. 3, 2016, which is a continuation of U.S. patent application Ser. No. 14/945, 794, filed Nov. 19, 2015 (U.S. Pat. No. 9,385,173), which is a continuation of U.S. patent application Ser. No. 14/616, 941, filed Feb. 9, 2015 (U.S. Pat. No. 9,287,331), which is a continuation of U.S. patent application Ser. No. 14/454, 211, filed Aug. 7, 2014 (U.S. Pat. No. 9,059,122), which is a continuation of U.S. patent application Ser. No. 14/197, 778, filed Mar. 5, 2014 (U.S. Pat. No. 8,841,672), which is a continuation of U.S. patent application Ser. No. 14/066, 106, filed Oct. 29, 2013 (U.S. Pat. No. 8,742,419), which is a continuation of U.S. patent application Ser. No. 12/660, 846, filed Mar. 5, 2010 (U.S. Pat. No. 8,610,122), which claims priority from Japanese Patent Application No. JP 2009-061713 filed in the Japanese Patent Office on Mar. 13, 2009, the entire contents of which are incorporated herein by reference.

BACKGROUND OF THE INVENTION

Field of the Invention

The present invention relates to a display unit including an organic EL (electro luminescence) device.

Description of the Related Art

In recent years, in the field of display units for displaying images, display units including as a light emitting device of a pixel, a current drive type optical device with the light emitting luminance changeable according to the flowing current value such as an organic EL device have been developed, and such display units are facilitated to be commercialized (for example, refer to Japanese Unexamined Patent Application Publication No. 2008-083272).

The organic EL device is a self-light emitting device differently from a liquid crystal device or the like. Thus, a display unit (organic EL display unit) including the organic EL device does not need a light source (backlight). Accordingly, in the organic EL display unit, compared to a liquid crystal display unit necessary for a light source, the image visibility is high, the electric power consumption is low, and the device response rate is high.

Drive systems in the organic EL display unit include simple (passive) matrix system and active matrix system as in the liquid crystal display unit. The former system has a disadvantage that it is difficult to realize a large and high definition display unit, though its structure is simple. Thus, currently, the active matrix system has been actively developed. In such a system, a current flowing through a light emitting device arranged for every pixel is controlled by an active device provided in a drive circuit provided for every light emitting device (in general, TFT (Thin Film Transistor)).

FIG. 15 illustrates a schematic structure of a general organic EL display unit. A display unit 100 illustrated in FIG. 15 includes a display section 110 in which a plurality of pixels 120 are arranged in a matrix state and a drive section for driving each pixel 120 (a horizontal drive circuit 130, a writing scanning circuit 140, and a power source scanning circuit 150).

Each pixel 120 is composed of a red-use pixel 120R, a green-use pixel 120G, and a blue-use pixel 120B. As illustrated in FIG. 16 and FIG. 17, the pixels 120R, 120G, and 120B are composed of an organic EL device 121 (organic EL devices 121R, 121G, and 121B) and a pixel circuit 122 connected thereto. FIG. 16 illustrates a circuit structure of the pixels 120R, 120G, and 120B. FIG. 17 illustrates a layout of the pixels 120R, 120G, and 120B.

The pixel circuit 122 is composed of a sampling-use transistor $T_{ws}$, a retentive capacity $C_s$, and a drive-use transistor $T_{Dr}$, and has a circuit structure of 2Tr1C. A gate line WSL drawn from the writing scanning circuit 140 is extended in the row direction, and is connected to a gate 123A of the transistor $T_{ws}$ through a contact 126A.

A drain line DSL drawn from the power source scanning circuit 150 is also extended in the row direction, and is connected to a drain 124C of the transistor $T_{Dr}$ through a leading wiring 128A. Further, a signal line DTL drawn from the horizontal drive circuit 130 is extended in the column direction, and is connected to a drain 123C of the transistor $T_{ws}$ through a contact 126B and a leading wiring 128B. A source 123B of the transistor $T_{ws}$ is connected to a gate 124A of the drive-use transistor $T_{Dr}$ and an end of the retentive capacity $C_s$ (terminal 125A) through a contact 126C. A source 124B of the transistor $T_{Dr}$ and the other end of the retentive capacity $C_s$ (terminal 125B) are connected to an anode 127A of the organic EL device 121 through a contact 126D. A cathode 127B of the organic EL device 121 is connected to an external cathode line CTL.

SUMMARY OF THE INVENTION

FIG. 18 illustrates an example of a cross sectional structure taken along line A-A of FIG. 17. In the section corresponding to line A-A of FIG. 17, the pixels 120R, 120G, and 120B have a gate insulating film 112, an insulating protective film 113, and an insulating planarizing film 114 over a substrate 111. Between the substrate 111 and the gate insulating film 112, a gate 124A (terminal 125A) and a gate 123A are formed.

In a position that is between the gate insulating film 112 and the insulating protective film 113 and that is directly above the gate 124A, a channel 131, sources 132 and 124B, drains 133 and 124C, and a protective film 134 are formed. The channel 131 is formed being contacted with the gate insulating film 112 directly above the gate 124A. In a position that is between the gate insulating film 112 and the insulating protective film 113 and that is directly above the gate 123A, a channel 135, drains 136 and 123C, sources 137 and 123B, and a protective film 138 are formed.

On the insulating planarizing film 114, the organic EL device 121 is formed. The organic EL device 121 has a structure in which, for example, an anode 127A, an organic layer 127C, and a cathode 127B are sequentially layered from the substrate 111 side. In the same plane as that of the anode 127A, a cathode auxiliary wiring 117 is provided with a given clearance between the anode 127A and the cathode auxiliary wiring 117. Between the anode 127A and the cathode auxiliary wiring 117, an aperture 117A exists.

The organic EL device 121 has, for example, as illustrated in FIG. 18, a structure in which, for example, the anode 127A, the organic layer 127C, and the cathode 127B are sequentially layered from the substrate 111 side. The anode 127A has a function as a reflecting layer, and the cathode 127B has a function as a semi-transmissive reflecting layer. The anode 127A and the cathode 127B compose a resonator structure that resonates light generated in a light emitting layer (not illustrated) included in the organic layer 127C. That is, the surface on the organic layer 127C side of the anode 127A and the surface on the organic layer 127C side of the cathode 127B structure a pair of reflecting mirrors. The light generated in the light emitting layer is resonated by the pair of reflecting mirrors, and is extracted from the cathode 127B side. Thereby, the light generated in the light emitting layer generates multiple interference, the resonator structure acts as a kind of a narrow band filter. Thereby, the half bandwidth of spectrum of the extracted light is decreased, and color purity is improved.

In the same plane as that of the anode 127A of the organic EL device 121, an aperture determination insulating film 115 is formed. On the organic EL device 121, an insulating protective film 116 is formed. The aperture determination insulating film 115 has an aperture (EL aperture 115A) corresponding to the anode 127A. The EL aperture 115A is formed in part of a region opposed to the upper face of the anode 127A. The aperture determination insulating film 115 covers an outer edge (peripheral edge) of the anode 127A. That is, only part of the upper face of the anode 127A is exposed on the bottom face of the EL aperture 115A. The organic layer 127C is contacted with the section exposed on the bottom face of the EL aperture 115A out of the upper face of the anode 127A.

In the same plane as that of the anode 127A, the cathode auxiliary wiring 117 surrounding the anode 127A is formed around the anode 127A. The cathode auxiliary wiring 117 is provided to uniformize in-plane potential distribution of the cathode 127B, and is electrically connected to the cathode 127B. The cathode auxiliary wiring 117 is arranged with a given clearance between the cathode auxiliary wiring 117 and the anode 127A, and the aperture 117A exists between the cathode auxiliary wiring 117 and the anode 127A. Thus, the cathode auxiliary wiring 117 retains insulation properties to the anode 127A.

As illustrated in FIG. 18, partial light L out of light generated in the light emitting layer is not outputted from the cathode 127B side, but is leaked to an adjacent pixel. In the case where the leaked light L enters a channel 131 of the transistors $T_{Dr}$ and $T_{ws}$ in the adjacent pixel, it results in error operation of the pixel circuit 122 such as increased light leak current.

In particular, in the case where blue light with short wavelength enters the channel 131, TFT characteristics are changed, for example, a threshold voltage Vth of a gate is shifted as time advances, resulting in lowered long-term reliability of the TFT. In the case where the channel 131 contains amorphous silicon (a-Si) or microcrystalline Si (μ-Si), lowering of long-term reliability of the TFT is significant.

For example, as illustrated in FIG. 19, the pixel 120B included in one pixel 120 is arranged between the pixel 120G included in said one pixel 120 and the pixel 120R included in another pixel 120 adjacent to said one pixel 120. In this case, the blue light L leaked from the organic layer 127C of the pixel 120B enters the transistor $T_{Dr}$ in the pixel 120G and the transistor $T_{ws}$ in the pixel 120R, resulting in lowered long-term reliability of the transistors $T_{Dr}$ and $T_{ws}$.

In view of the foregoing disadvantage, in the invention, it is desirable to provide a display unit with which lowering of long-term reliability of a transistor is able to be decreased.

According to an embodiment of the invention, there is provided a display unit including a display section having a plurality of organic EL devices with light emitting color different from each other and a plurality of pixel circuits that are singly provided for every said organic EL device for every pixel. The pixel circuit has a first transistor for writing a video signal, a second transistor for driving the organic EL device based on the video signal written by the first transistor, and a retentive capacity. Out of the first transistor and the second transistor, a third transistor provided correspondingly to a second organic EL device adjacent to a first organic EL device is arranged farther from the first organic EL device than a first retentive capacity provided correspondingly to the second organic EL device.

In the display unit according to the embodiment of the invention, the third transistor provided correspondingly to the second organic EL device adjacent to the first organic EL device is arranged farther from the first organic EL device than the first retentive capacity provided correspondingly to the second organic EL device. Thus, compared to a case that a distance A from the third transistor to the first organic EL device is smaller than a distance B from the first retentive capacity to the organic EL device, entrance amount of light leaked from the organic layer in the first organic EL device into the third transistor is small.

According to the display unit of the embodiment of the invention, compared to the foregoing case that the distance A is smaller than the distance B, light leaked from the organic layer in the first organic EL device into the third transistor is small. Thereby, in the case where the first organic EL device has an organic layer that generates light capable of deteriorating the first transistor and the second transistor, lowering of long-term reliability of the third transistor is able to be decreased.

Other and further objects, features and advantages of the invention will appear more fully from the following description.

DETAILED DESCRIPTION OF THE PREFERRED EMBODIMENT

Figure 1:
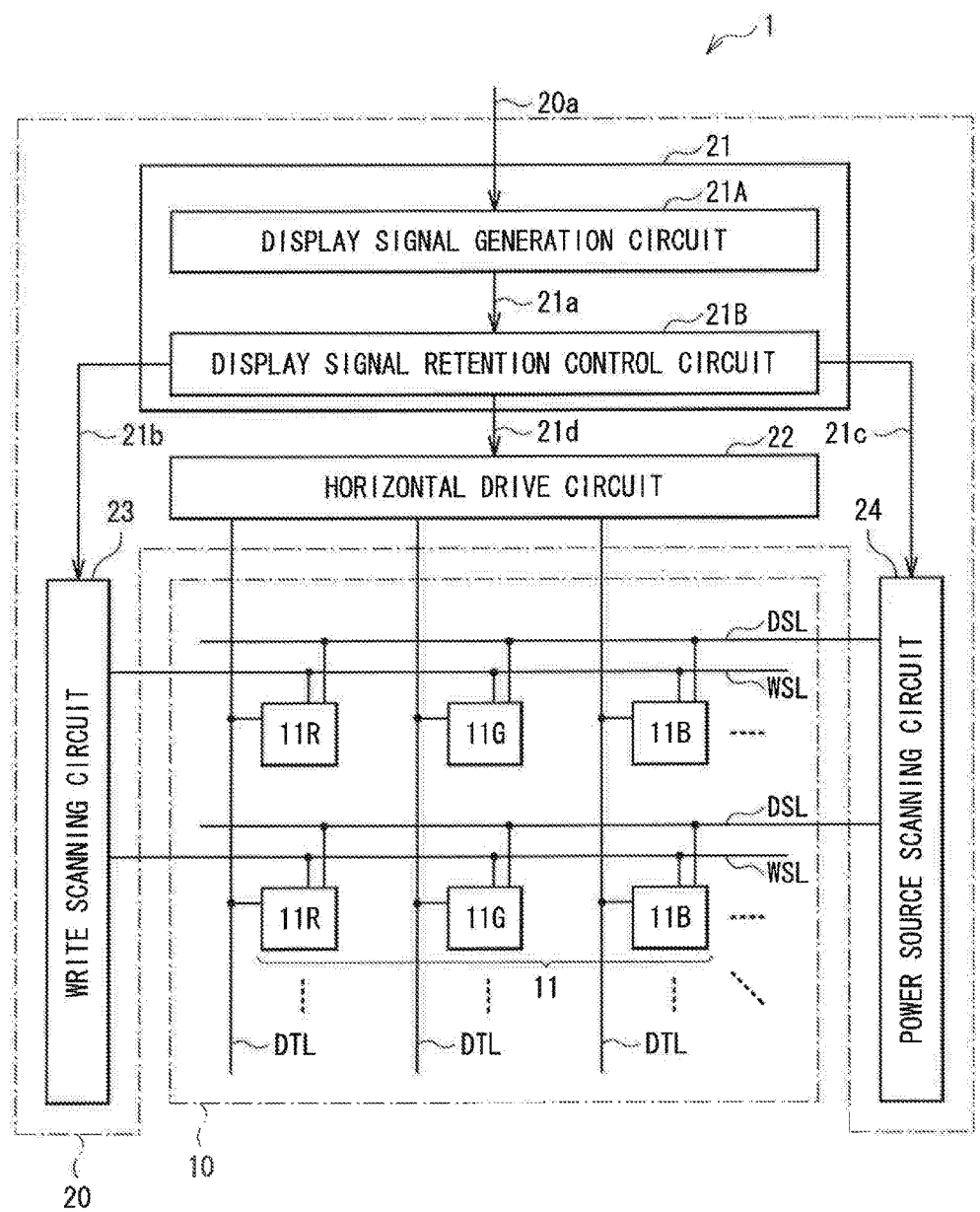
FIG. 1 is a schematic view of a display unit according to an embodiment of the invention.

An embodiment of the invention will be hereinafter described in detail with reference to the drawings. The description will be given in the following order:

1. Schematic structure
2. Layout
3. Cross sectional structure
4. Operation and effect
5. Modified example
6. Module and application examples Schematic Structure FIG. 1 illustrates an example of a whole structure of a display unit 1 according to an embodiment of the invention. The display unit 1 includes a display section 10 and a peripheral circuit section 20 (drive section) formed on the periphery of the display section 10 on a substrate 40 (described later) made of, for example, glass, a silicon (Si) wafer, a resin or the like.

In the display section 10, a plurality of pixels 11 are arranged in a matrix state over the whole area of the display section 10. The display section 10 displays an image based on a picture signal 20a inputted from outside by active matrix drive. Each pixel 11 includes a red-use pixel 11R, a green-use pixel 11G, and a blue-use pixel 11B.

Figure 2:
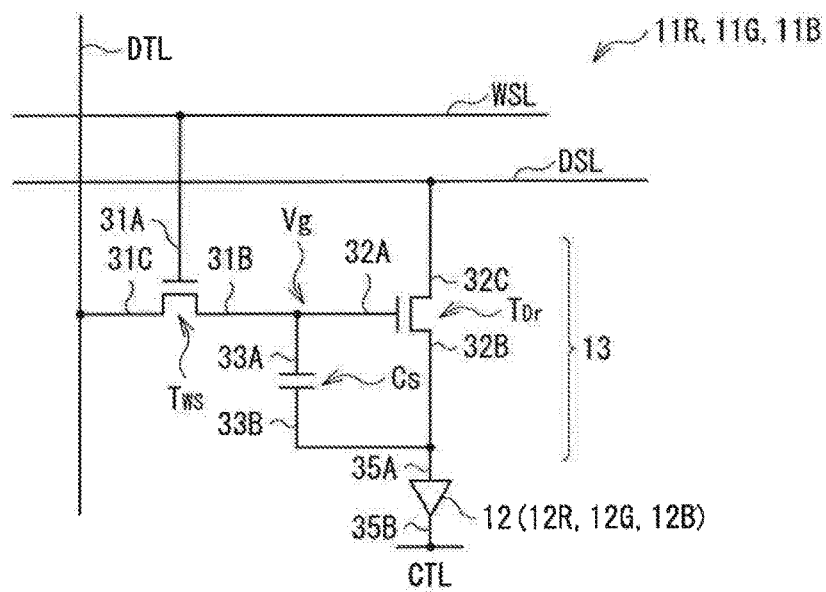
FIG. 2 is a circuit diagram of the pixel of FIG. 1.

FIG. 2 illustrates an example of a circuit structure of the pixels 11R, 11G, and 11B. In the pixels 11R, 11G, and 11B, as illustrated in FIG. 2, organic EL devices 12 (12R, 12G, and 12B) and a pixel circuit 13 are provided. The organic EL device 12B of this embodiment corresponds to a specific example of "first organic EL device" of the invention. The organic EL devices 12R and 12G of this embodiment correspond to a specific example of "second organic EL device" of the invention.

The pixel circuit 13 is composed of a transistor $T_{ws}$, a transistor $T_{Dr}$, and a retentive capacity $C_s$ connected between a gate and a source of the transistor $T_{Dr}$, and has a circuit structure of 2Tr1C. The transistor $T_{ws}$ is a writing-use transistor for writing a video signal. The transistor $T_{Dr}$ is a drive-use transistor for driving the organic EL devices 12 based on the video signal written by the transistor $T_{ws}$. The transistors $T_{ws}$ and $T_{Dr}$ are formed from, for example, an n channel MOS type thin film transistor (TFT (Thin Film Transistor)).

The transistor $T_{ws}$ of this embodiment corresponds to a specific example of "first transistor" of the invention. The transistor $T_{Dr}$ of this embodiment corresponds to a specific example of "second transistor" of the invention. Further, in this embodiment, the transistors $T_{ws}$ and $T_{Dr}$ included in the pixels 11R and 11G correspond to a specific example of "third transistor" of the invention, and are transistors provided correspondingly to the organic EL devices 12R and 12G adjacent to the organic EL device 12B. Further, in this embodiment, the retentive capacity $C_s$ included in the pixels 11R and 11G correspond to a specific example of "first retentive capacity" of the invention, and is a retentive capacity provided correspondingly to the organic EL devices 12R and 12G.

The peripheral circuit section 20 has a timing control circuit 21, a horizontal drive circuit 22, a writing scanning circuit 23, and a power source scanning circuit 24. The timing control circuit 21 includes a display signal generation circuit 21A and a display signal retention control circuit 21B. Further, in the peripheral circuit section 20, a gate line WSL, a drain line DSL, a signal line DTL, and a ground line GND are provided. The ground line is intended to be connected to the ground, and a ground voltage (reference voltage) is obtained when the ground line is connected to the ground.

The display signal generation circuit 21A is intended to generate a display signal 21a for performing display on the display section 10, for example, for every 1 screen (for every 1 field display) based on a video signal 20a inputted from outside.

The display signal retention control circuit 21B is intended to store and retain the display signal 21a outputted from the display signal generation circuit 21A for every 1 screen (for every 1 field display) into a field memory composed of, for example, an SRAM (Static Random Access Memory). The display signal retention control circuit 21B further plays a role to exercise control so that the horizontal drive circuit 22, the writing scanning circuit 23, and the power source scanning circuit 24 for driving each pixel 11 are operated simultaneously with each other. Specifically, the display signal retention control circuit 21B outputs a control signal 21b to the writing scanning circuit 23, outputs a control signal 21c to the power source scanning circuit 24, and outputs a control signal 21d to the display signal drive circuit 21C respectively.

The horizontal drive circuit 22 is able to output a voltage according to the control signal 21d outputted from the display signal retention control circuit 21B. Specifically, the horizontal drive circuit 22 is intended to supply a given voltage to the pixel 11 selected by the writing scanning circuit 23 through the signal line DTL connected to each pixel 11 of the display section 10.

The writing scanning circuit 23 is able to output a voltage according to the control signal 21b outputted from the display signal retention control circuit 21B. Specifically, the writing scanning circuit 23 is intended to supply a given voltage to the pixel 11 as a drive target through the gate line WSL connected to each pixel 11 of the display section 10 to control the sampling-use transistor $T_{ws}$.

The power source scanning circuit 24 is able to output a voltage according to the control signal 21c outputted from the display signal retention control circuit 21B. Specifically, the power source scanning circuit 24 is intended to supply a given voltage to the pixel 11 as a drive target through the drain line DSL connected to each pixel 11 of the display section 10 to control emitting and extinguishing light of the organic EL device 12R and the like.

Layout

Figure 3:
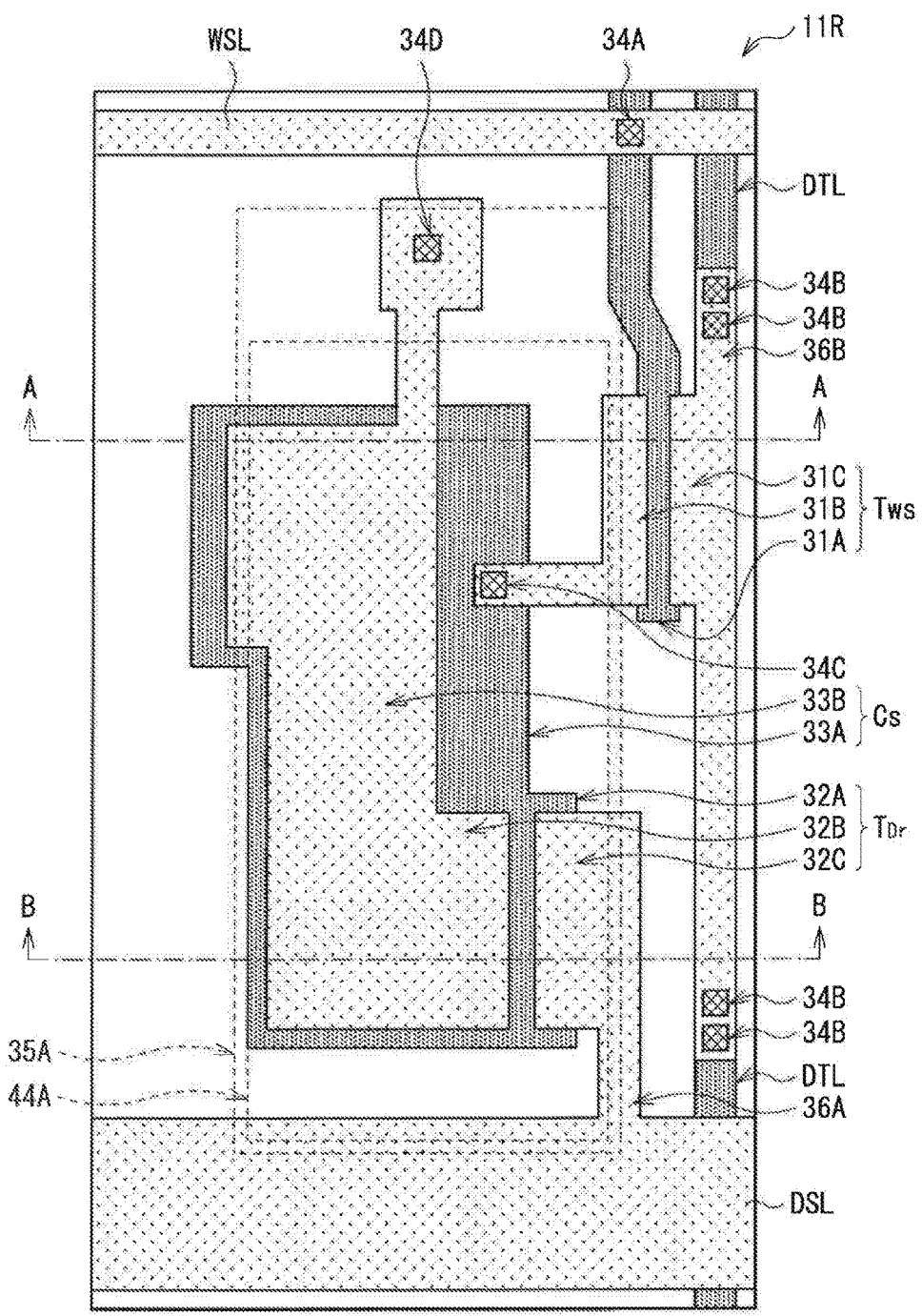
FIG. 3 is a layout diagram of the red-use pixel of FIG. 1.
Figure 4:
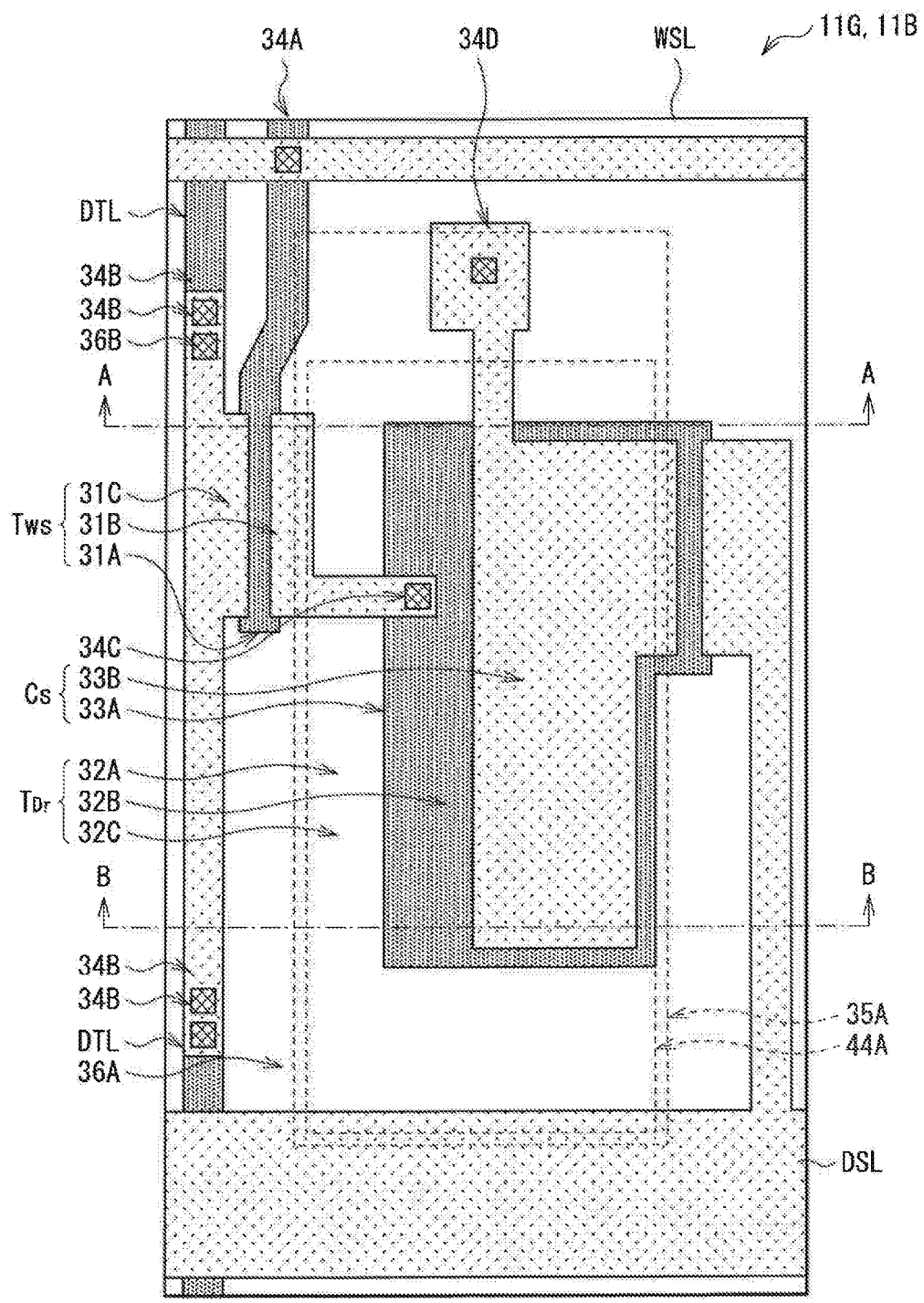
FIG. 4 is a layout diagram of the blue-use pixel and the green-use pixel of FIG. 1.
Figure 5:
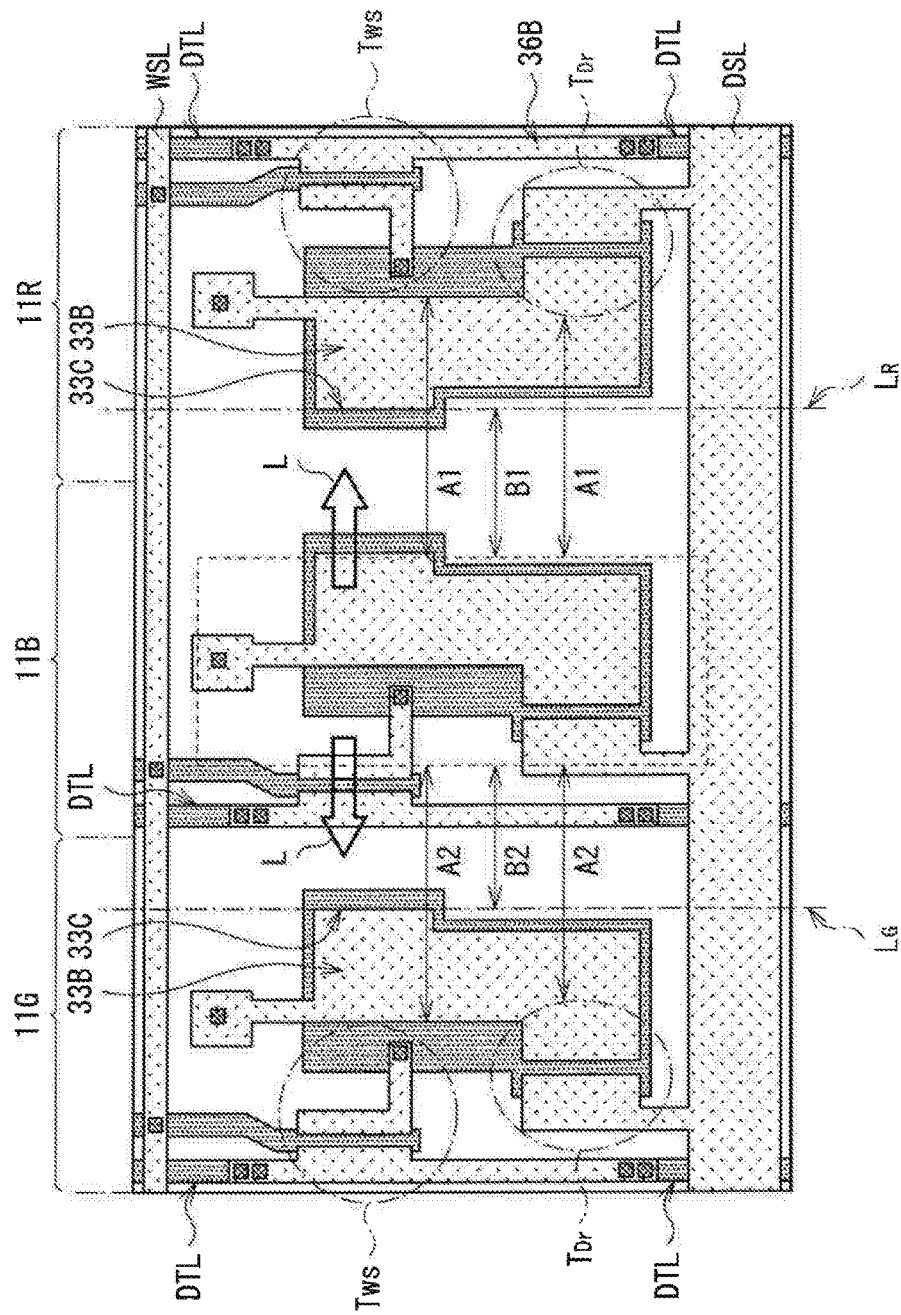
FIG. 5 is a layout diagram of the pixel of FIG. 1.

Next, a description will be given of a connection relation and arrangement of each element with reference to FIG. 2 to FIG. 5. FIG. 3 illustrates an example of layout of the pixel 11R. FIG. 4 illustrates an example of layout of the pixels 11G and 11B. FIG. 5 illustrates an example of layout of the pixel 11. FIG. 5 illustrates the pixels 11G and 11B included in one pixel 11 and the pixel 11R included in another pixel 11 adjacent to said one pixel 11.

First, a description will be given of points common to the respective pixels 11R, 11G, and 11B. The gate line WSL drawn from the writing scanning circuit 23 is extended in the row direction, and is connected to a gate 31A of the transistor $T_{ws}$ through a contact 34A. The drain line DSL drawn from the power source scanning circuit 24 is also extended in the row direction, and is connected to a drain 32C of the transistor $T_{Dr}$ through a leading wiring 36A. Further, the signal line DTL drawn from the horizontal drive circuit 22 is extended in the column direction, and is connected to a drain 31C of the transistor $T_{ws}$ through a contact 34B and a leading wiring 36B. A source 31B of the transistor $T_{ws}$ is connected to a gate 32A of the drive-use transistor $T_{Dr}$ and an end of the retentive capacity $C_s$ (terminal 33A). A source 32B of the transistor $T_{Dr}$ and the other end of the retentive capacity $C_s$ (terminal 33B) are connected to an anode 35A of the organic EL device 12 through a contact 34D. A cathode 35B of the organic EL device 12 is connected to a cathode line CTL.

Next, a description will be mainly given of points of the respective pixels 11R, 11G, and 11B that are different from each other. The pixels 11R, 11G, and 11B are arranged in the raw direction in this order in said one pixel 11. That is, the pixel 11G is arranged to the right of the pixel 11R (to the right of the pixel 11R in the raw direction), the pixel 11B is arranged to the right of the pixel 11G, and the pixel 11R of another pixel 11 is arranged to the right of the pixel 11B.

For example, as illustrated in FIG. 3 and FIG. 5, the pixel 11R has a layout obtained by mirror-reversing the layout of the pixel 11B. The transistors $T_{Dr}$ and $T_{WS}$ in the pixel 11R are arranged farther from the organic EL device 11B in the adjacent pixel 11B than the retentive capacity $C_s$ in the pixel 11R. That is, the transistors $T_{Dr}$ and $T_{WS}$ in the pixel 11R are arranged on the side opposite to the organic EL device 11B in the adjacent pixel 11B with respect to a line $L_R$ that is contacted with the end section on the pixel 11B side out of the retentive capacity $C_s$ in the pixel 11R and that is extended in the column direction. As illustrated in FIG. 5, the transistors $T_{Dr}$ and $T_{WS}$ in the pixel 11R are preferably arranged on the side opposite to the organic EL device 11B in the adjacent pixel 11B with respect to the retentive capacity $C_s$ in the pixel 11R. That is, the transistors $T_{Dr}$ and $T_{WS}$ in the pixel 11R are preferably arranged in a region farthest from the organic EL device 11B in the adjacent pixel 11B out of the pixel 11R.

For example, as illustrated in FIG. 4 and FIG. 5, the pixel 11G has a layout obtained by mirror-reversing the layout of the pixel 11R. The transistors $T_{Dr}$ and $T_{WS}$ in the pixel 11G are arranged farther from the organic EL device 11B in the adjacent pixel 11B than the retentive capacity $C_s$ in the pixel 11G. That is, the transistors $T_{Dr}$ and $T_{WS}$ in the pixel 11G are arranged on the side opposite to the organic EL device 11B in the adjacent pixel 11B with respect to a line $L_G$ that is contacted with the end section on the pixel 11B side out of the retentive capacity $C_s$ in the pixel 11G and that is extended in the column direction. The transistors $T_{Dr}$ and $T_{WS}$ in the pixel 11G are preferably arranged on the side opposite to the organic EL device 11B in the adjacent pixel 11B with respect to the retentive capacity $C_s$ in the pixel 11G. That is, the transistors $T_{Dr}$ and $T_{WS}$ in the pixel 11G are preferably arranged in a region farthest from the organic EL device 11B in the adjacent pixel 11B out of the pixel 11G.

For example, as illustrated in FIG. 5, the pixel 11B has the same layout as the layout of the pixel 11G. The transistors $T_{Dr}$ and $T_{WS}$ in the pixel 11B are arranged closer to the organic EL device 11G in the adjacent pixel 11G than the retentive capacity $C_s$ in the pixel 11B. The pixel 11B may have a layout different from the layout of the pixel 11G.

Cross Sectional Structure

Figure 6:
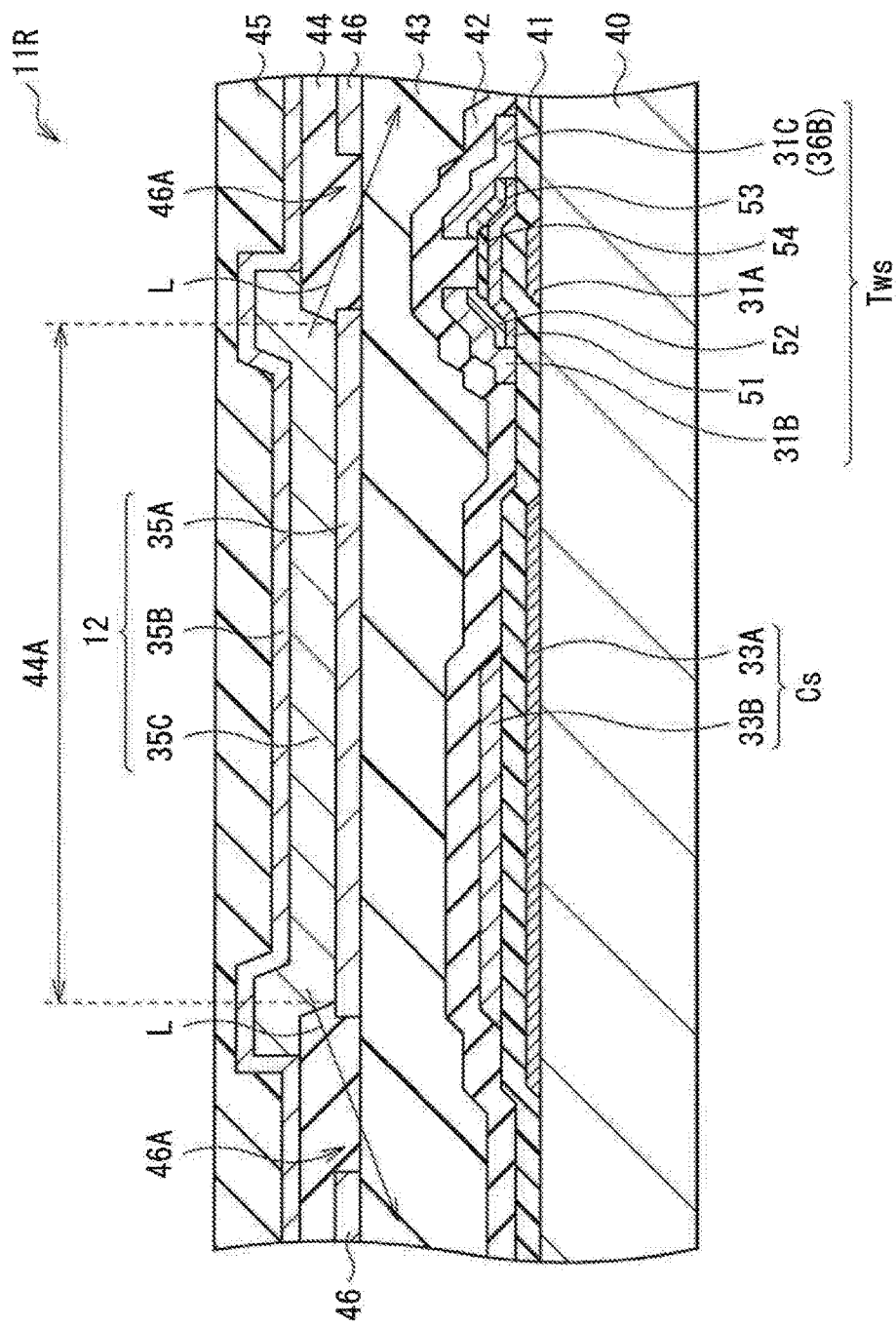
FIG. 6 is a cross sectional view taken along line A-A of the pixel of FIG. 3.
Figure 7:
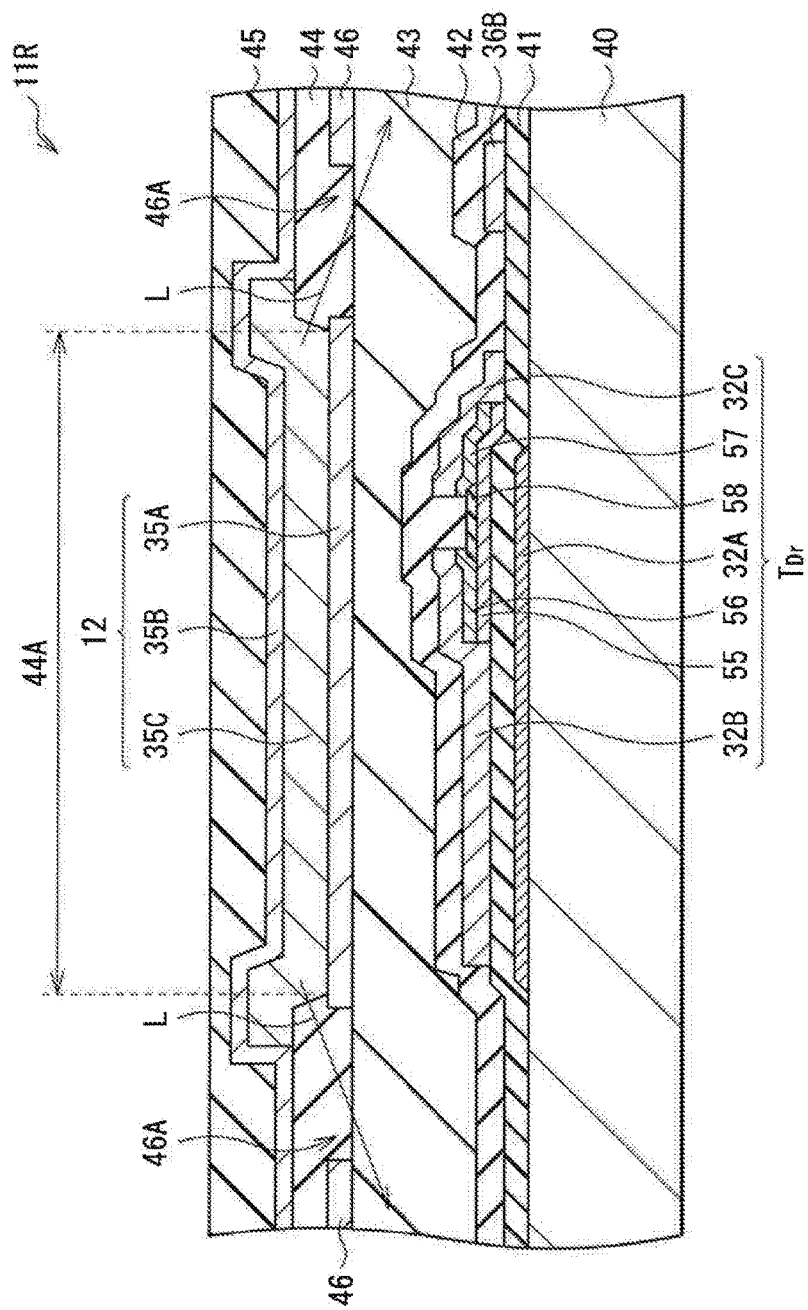
FIG. 7 is a cross sectional view taken along line B-B of the pixel of FIG. 3.

FIG. 6 illustrates a cross sectional structure taken along line A-A of FIG. 3. FIG. 6 includes a cross section of the transistor $T_{ws}$. FIG. 7 illustrates a cross sectional structure taken along line B-B of FIG. 3. FIG. 7 includes a cross section of the transistor $T_{Dr}$. In this embodiment, a cross sectional structure obtained by mirror-reversing the cross sectional structure of FIG. 6 corresponds to, for example, a cross sectional structure taken along line A-A of FIG. 4, and a cross sectional structure obtained by mirror-reversing the cross sectional structure of FIG. 7 corresponds to, for example, a cross sectional structure taken along line B-B of FIG. 4.

The pixels 11R, 11G, and 11B have a gate insulating film 41, an insulating protective film 42, and an insulating planarizing film 43 over a substrate 40 in the section corresponding to line A-A and line B-B of FIG. 3. The gate insulating film 41 functions as a gate insulating film of the transistors $T_{ws}$ and $T_{Dr}$. The insulating protective film 42 is intended to cover and protect the transistors $T_{ws}$ and $T_{Dr}$. The insulating planarizing film 43 is provided to planarize the base of the organic EL device 12, and cover the whole surface of the insulating protective film 42.

In the section corresponding to line A-A of FIG. 3 (section including the cross section of the transistor $T_{ws}$), the gate 31A and the terminal 33A are formed between the substrate 40 and the gate insulating film 41. Meanwhile, in the section corresponding to line A-A of FIG. 4 (section including the cross section of the transistor $T_{Dr}$), the gate 32A is generally formed between the substrate 40 and the gate insulating film 41. The gate 31A is formed around a region opposed to an EL aperture 44A described later. The terminal 33A and the gate 32A are generally formed in a region opposed to the EL aperture 44A. The gate insulating film 41 covers the whole surface including the substrate 40, the gates 31A and 32A, and the terminal 33A.

In a position that is between the gate insulating film 41 and the insulating protective film 42 and that is directly above the gate 31A, a channel 51, sources 52 and 31B, drains 53 and 31C, a leading wiring 36B, and a protective film 54 are formed. The channel 51 is formed being contacted with the gate insulating film 41 directly above the gate 31A. The source 52 is contacted with an end of the channel 51. The source 31B is contacted with the source 52. The drain 53 is contacted with the other end of the channel 51. The drain 31C is contacted with the drain 53. The channel 51, the source 52, and the drain 53 contain, for example, amorphous silicon (a-Si), microcrystalline Si (µ-Si), or low temperature polysilicon. The protective film 54 is formed between the sources 52, 31B and the drains 53, 31C, and covers a region not contacted with the source 52 and the drain 53 out of the channel 51.

In a position that is between the gate insulating film 41 and the insulating protective film 42 and that is directly above the gate 32A, a channel 55, sources 56 and 32B, drains 57 and 32C, and a protective film 58 are formed. Further, in a position that is between the gate insulating film 41 and the insulating protective film 42 and that is to the side of the drain 32C, a leading wiring 36B is formed. The channel 55 is formed being contacted with the gate insulating film 41 directly above the gate 32A. The source 56 is contacted with an end of the channel 55. The source 32B is contacted with the source 56. The drain 57 is contacted with the other end of the channel 55. The drain 32C is contacted with the drain 57. The channel 55, the source 56, and the drain 57 contain, for example, amorphous silicon (a-Si), microcrystalline Si (µ-Si), or low temperature polysilicon.

The protective film 58 is formed between the sources 56, 32B and the drains 57, 32C, and covers a region not contacted with the source 56 and the drain 57 out of the channel 55.

The pixels 11R, 11G, and 11B have the organic EL device 12 on the insulating planarizing film 43. The organic EL device 12 has a structure in which, for example, an anode 35A, an organic layer 35C, and a cathode 35B are sequentially layered from the substrate 40 side. The organic layer 35C includes, for example, an electron hole injection layer for improving efficiency of electron hole injection, an electron hole transport layer for improving efficiency of electron hole transport to the light emitting layer, a light emitting layer for generating light emission by electron-hole recombination, and an electron transport layer for improving efficiency of electron transport to the light emitting layer sequentially from the anode 35A side. The organic layer 35C of the pixel 11R contains a material emitting red light. The organic layer 35C of the pixel 11G contains a material emitting green light. The organic layer 35C of the pixel 11B contains a material emitting blue light. The blue light emitted from the organic layer 35C of the pixel 11B strongly has characteristics capable of deteriorating the transistor in the pixels 11R and 11G adjacent to the pixel 11B. The red light emitted from the organic layer 35C of the pixel 11R and the green light emitted from the organic layer 35C of the pixel 11G slightly have characteristics capable of deteriorating the transistor in the pixel adjacent to the pixel 11R or the pixel 11G.

The anode 35A has a function as a reflecting layer, and the cathode 35B has a function as a semi-transmissive reflecting layer. The anode 35A and the cathode 35B compose a resonator structure that resonates light generated in the light emitting layer 35C. That is, the surface on the organic layer 35C side of the anode 35A and the surface on the organic layer 35C side of the cathode 35B structure a pair of reflecting mirrors. The light generated in the light emitting layer 35C is resonated by the pair of reflecting mirrors, and is extracted from the cathode 35B side. Thereby, the light generated in the light emitting layer 35C generates multiple interference, the resonator structure acts as a kind of a narrow band filter. Thereby, the half bandwidth of spectrum of the extracted light is decreased, and color purity is improved.

The pixels 11R, 11G, and 11B have an aperture determination insulating film 44 in the same plane as that of the anode 35A of the organic EL device 12, and has an insulating protective film 45 on the organic EL device 12.

The aperture determination insulating film 44 has an aperture (EL aperture 44A) corresponding to the anode 35A. The EL aperture 44A is formed in part of a region opposed to the upper face of the anode 35A. The aperture determination insulating film 44 covers an outer edge (peripheral edge) of the anode 35A. That is, only part of the upper face of the anode 35A is exposed on the bottom face of the EL aperture 44A. The organic layer 35C is contacted with the section exposed on the bottom face of the EL aperture 44A out of the upper face of the anode 35A.

The insulating protective film 45 covers the whole surface of the cathode 35B. The insulating protective film 45 is formed from a material transparent to light emitted in the organic EL device 12. Thus, the insulating protective film 45 is able to pass not only the light emitted in the organic EL device 12 but also outside light in the same wavelength as that of the light emitted in the organic EL device 12.

In the same plane as that of the anode 35A, a cathode auxiliary wiring 46 surrounding the anode 35A is formed around the anode 35A. The cathode auxiliary wiring 46 is provided to uniformize in-plane potential distribution of the cathode 35B, and is electrically connected to the cathode 35B. The cathode auxiliary wiring 46 is arranged with a given clearance between the cathode auxiliary wiring 46 and the anode 35A, and an aperture 46A exists between the cathode auxiliary wiring 46 and the anode 35A. Thus, the cathode auxiliary wiring 46 retains insulation properties to the anode 35A.

Operation and Effect

In the display unit 1 of this embodiment, the pixel circuit 13 is on/off controlled in the respective pixels 11R, 11G, and 11B, and a drive current is injected to the organic EL device 12 of the respective pixels 11R, 11G, and 11B. Thereby, electron-hole recombination is generated to initiate light emission. The light is reflected in a multiple fashion between the anode 35A and the cathode 35B, is transmitted through the cathode 35B, and is extracted outside. In the result, an image is displayed in the display section 10.

Figure 18:
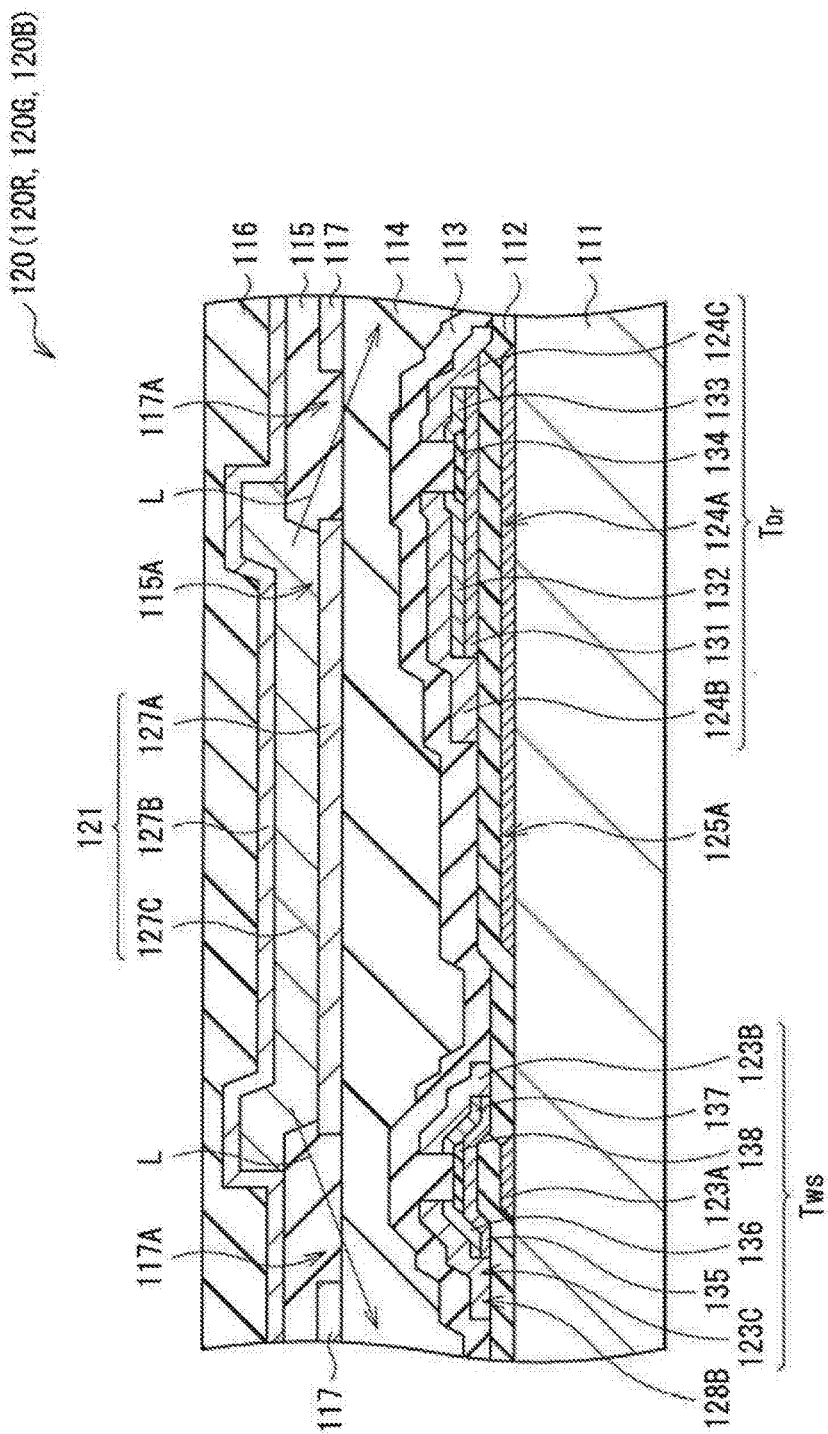
FIG. 18 is a cross sectional view taken along line A-A of the pixel of FIG. 17.

In general, in the organic EL display unit, for example, as illustrated in FIGS. 6, 7, and 18, partial light L out of light generated in the organic layer 35C (127C) is not outputted from the cathode 35B (127B) side, but is leaked to the adjacent pixel. For example, as illustrated in FIG. 19, in the case where the leaked light L enters the transistors $T_{Dr}$ and $T_{ws}$ (in particular, the channel 131) in the adjacent pixel, it results in error operation of the pixel circuit 122 such as increased light leak current.

In particular, in the case where blue light with short wavelength enters the channel 131, TFT characteristics are changed, for example, the threshold voltage Vth of the gate is shifted as time advances, resulting in lowered long-term reliability of the TFT. In the case where the channel 131 contains amorphous silicon (a-Si) or microcrystalline Si (μ-Si), lowering of long-term reliability of the TFT is significant.

Figure 19:
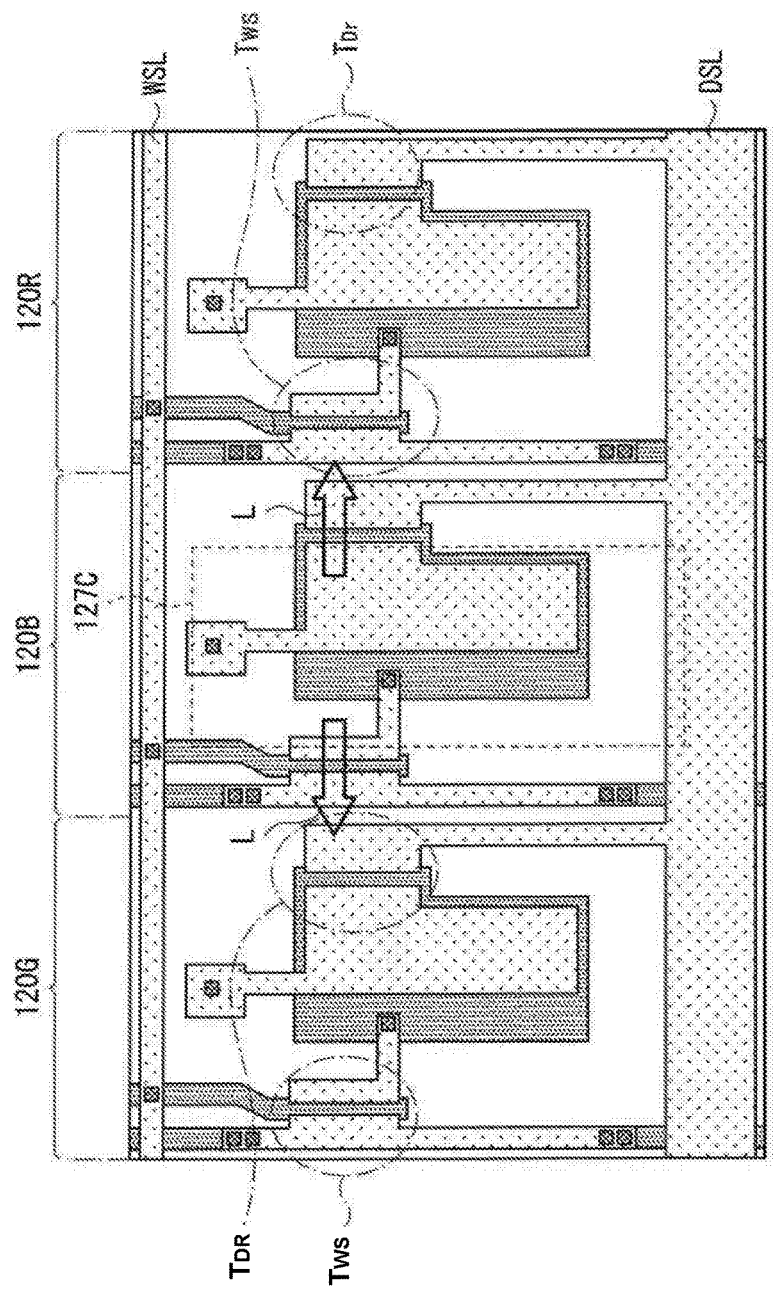
FIG. 19 is a layout diagram of the pixel of FIG. 15.

For example, as illustrated in FIG. 19, the pixel 120B included in one pixel 120 is arranged between the pixel 120G included in said one pixel 120 and the pixel 120R included in another pixel 120 adjacent to said one pixel 120. In this case, the blue light L leaked from the organic layer 127C of the pixel 120B enters the transistor $T_{Dr}$ in the pixel 120G and the transistor $T_{ws}$ in the pixel 120R, resulting in lowered long-term reliability of the transistors $T_{Dr}$ and $T_{ws}$.

Meanwhile, in this embodiment, for example, as illustrated in FIG. 5, the transistors $T_{Dr}$ and $T_{ws}$ in the pixel 11R adjacent to the pixel 11B are arranged farther from the pixel 11B than the retentive capacity $C_s$ in the pixel 11R. Further, the transistors $T_{Dr}$ and $T_{ws}$ in the pixel 11G adjacent to the pixel 11B are arranged farther from the pixel 11B than the retentive capacity $C_s$ in the pixel 11G. Thus, a distance A1 from the transistors $T_{Dr}$ and $T_{ws}$ in the pixel 11R to the organic EL device 12 in the pixel 11B is larger than a distance B1 from the retentive capacity $C_s$ in the pixel 11R to the organic EL device 12 in the pixel 11B. Further, a distance A2 from the transistors $T_{ws}$ and $T_{Dr}$ in the pixel 11G to the organic EL device 12 in the pixel 11B is larger than a distance B2 from the retentive capacity $C_s$ in the pixel 11G to the organic EL device 12 in the pixel 11B. Thereby, compared to a case that the distance A1 is smaller than the distance B1 and further the distance A2 is smaller than the distance B2, entrance amount of the light L leaked from the organic layer 35C in the pixel 11B into the transistors $T_{Dr}$ and $T_{ws}$ in the pixels 11R and 11G adjacent to each other is small. In the result, even if the channels 51 and 55 contain amorphous silicon (a-Si) or microcrystalline Si (μ-Si), lowering of long-term reliability of the transistor is able to be decreased.

Figure 8:
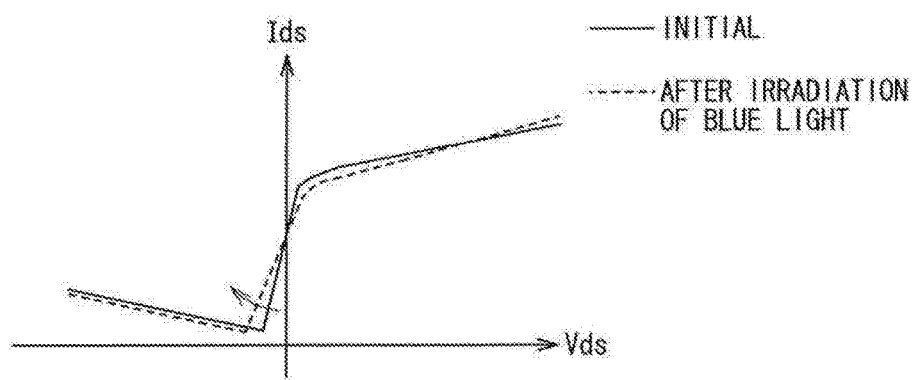
FIG. 8 is a characteristics diagram illustrating V-I characteristics of the pixel of FIG. 1.

In the case where deterioration of the transistors $T_{Dr}$ and $T_{ws}$ is predictable, even if characteristics of the transistors $T_{Dr}$ and $T_{ws}$ are changed, a voltage applied to the organic EL device 12 is able to be set (corrected) to a desired value. However, in the case where blue light with a short wavelength enters the channel of the transistors $T_{Dr}$ and $T_{ws}$ and thereby the characteristics of the transistors $T_{Dr}$ and $T_{ws}$ are changed, such change is hardly predicted accurately. For example, as illustrated in FIG. 8, if blue light is irradiated, S value is gradually decreased in Vds-Ids characteristics of the transistors $T_{Dr}$ and $T_{ws}$. However, change of the S value is hardly made. Thus, it is not easy to set (correct) a voltage applied to the organic EL device 12 to a desired value while considering deterioration due to blue light.

However, in this embodiment, as described above, the entrance amount of the light L leaked from the organic layer 35C in the pixel 11B into the transistors $T_{Dr}$ and $T_{ws}$ in the pixels 11R and 11G adjacent to each other is small. Thus, it is almost not necessary to make a correction while considering deterioration due to blue light. Thus, high display quality is able to be retained for a long time.

MODIFIED EXAMPLES

In the foregoing embodiment, the case that the pixels 11R, 11G, and 11B emitting three color light are provided in one pixel 11 has been exemplified. However, it is possible to further provide a pixel emitting other color light. Further, it is possible to provide a pixel other than the pixels 11R and 11G in one pixel 11. In the foregoing both cases, in other pixel adjacent to the pixel 11B, the transistors $T_{Dr}$ and $T_{ws}$ are preferably arranged far from the pixel 11B as much as possible.

Module and Application Examples

Figure 9:
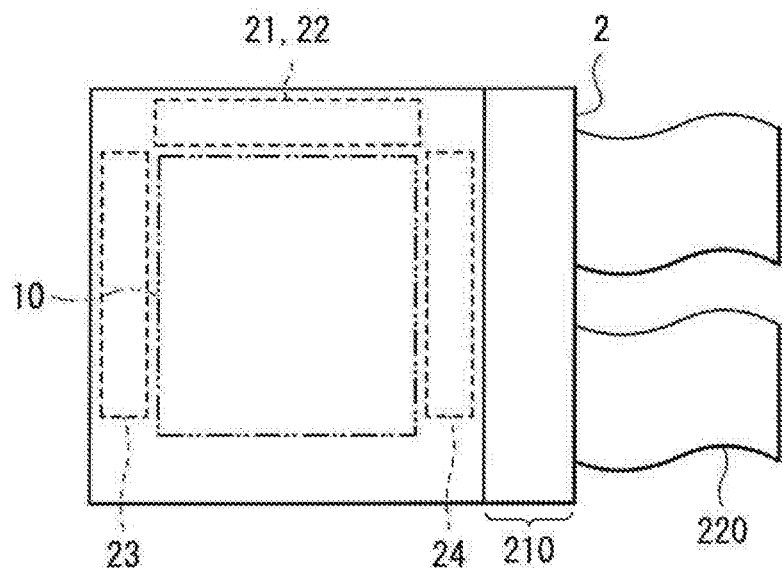
FIG. 9 is a plan view illustrating a schematic structure of a module including the display unit of the foregoing embodiment.

A description will be given of application examples of the display unit described in the foregoing embodiment and the modified examples thereof. The display unit of the foregoing embodiment and the like is able to be applied to a display unit of electronic devices in any field for displaying a video signal inputted from outside or a video signal generated inside as an image or a video such as a television device, a digital camera, a notebook personal computer, a portable terminal device such as a mobile phone, and a video camera.
Module The display unit of the foregoing embodiment and the like is incorporated in various electronic devices such as aftermentioned first to fifth application examples as a module as illustrated in FIG. 9, for example. In the module, for example, a region 210 exposed from a member (not illustrated) sealing the display section 10 is provided in a side of a substrate 2, and an external connection terminal (not illustrated) is formed in the exposed region 210 by extending wirings of the timing control circuit 21, the horizontal drive circuit 22, the writing scanning circuit 23, and the power source scanning circuit 24. The external connection terminal may be provided with a Flexible Printed Circuit (FPC) 220 for inputting and outputting a signal.

First Application Example

Figure 10:
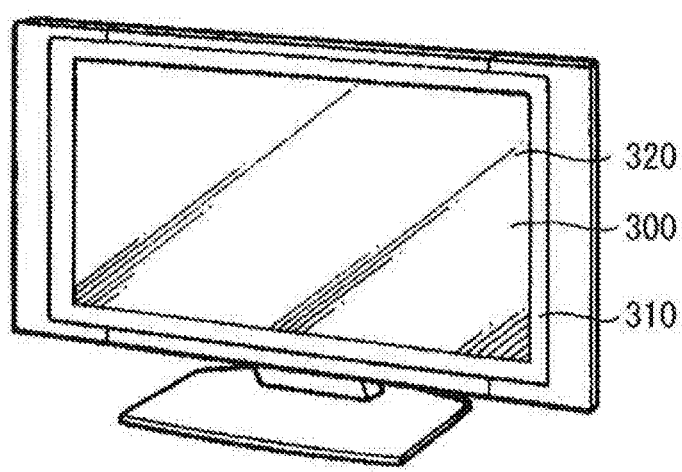
FIG. 10 is a perspective view illustrating an appearance of a first application example of the display unit of the foregoing embodiment.

FIG. 10 illustrates an appearance of a television device to which the display unit of the foregoing embodiment and the like is applied. The television device has, for example, a video display screen section 300 including a front panel 310 and a filter glass 320. The video display screen section 300 is composed of the display unit of the foregoing embodiment and the like.

Second Application Example

Figure 11A:
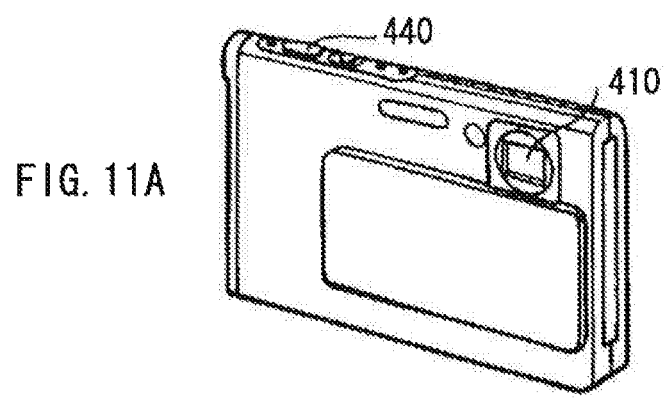
FIG. 11A is a perspective view illustrating an appearance viewed from the front side of a second application example.
Figure 11B:
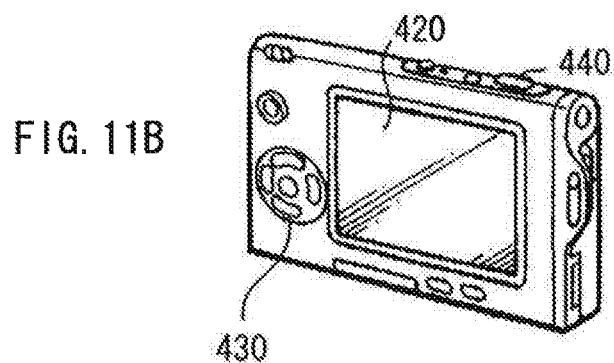
FIG. 11B is a perspective view illustrating an appearance viewed from the rear side of the second application example.

FIGS. 11A and 11B illustrate an appearance of a digital camera to which the display unit of the foregoing embodiment and the like is applied. The digital camera has, for example, a light emitting section for a flash 410, a display section 420, a menu switch 430, and a shutter button 440. The display section 420 is composed of the display unit according to the foregoing embodiment and the like.

Third Application Example

Figure 12:
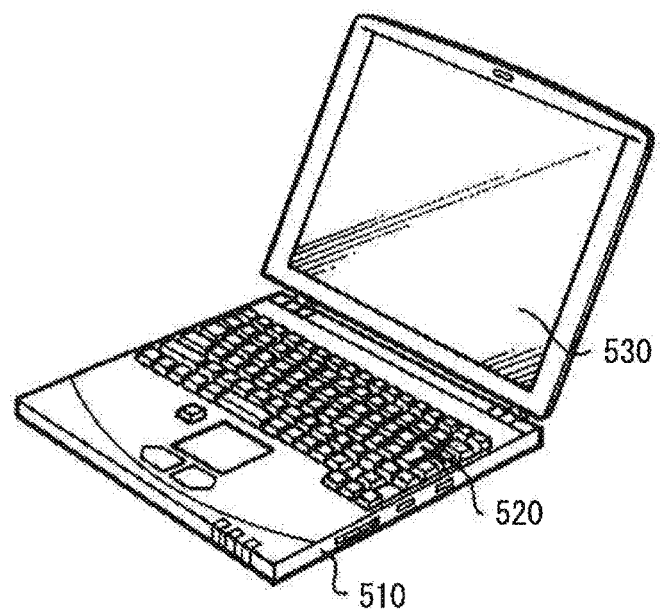
FIG. 12 is a perspective view illustrating an appearance of a third application example.

FIG. 12 illustrates an appearance of a notebook personal computer to which the display unit of the foregoing embodiment and the like is applied. The notebook personal computer has, for example, a main body 510, a keyboard 520 for operation of inputting characters and the like, and a display section 530 for displaying an image. The display section 530 is composed of the display unit according to the foregoing embodiment and the like.

Fourth Application Example

Figure 13:
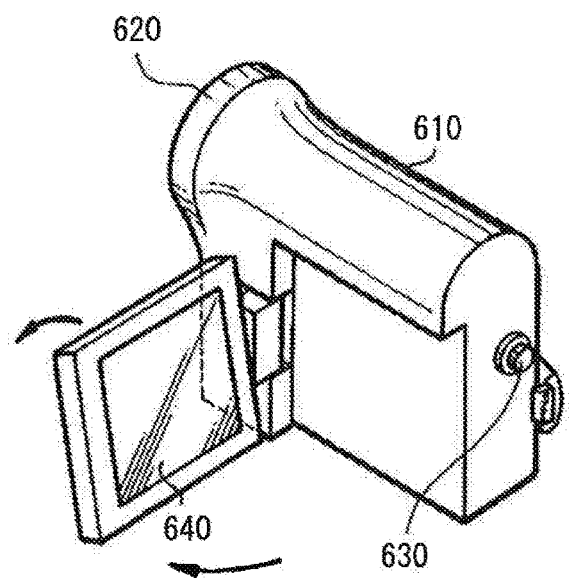
FIG. 13 is a perspective view illustrating an appearance of a fourth application example.
Figure 14:
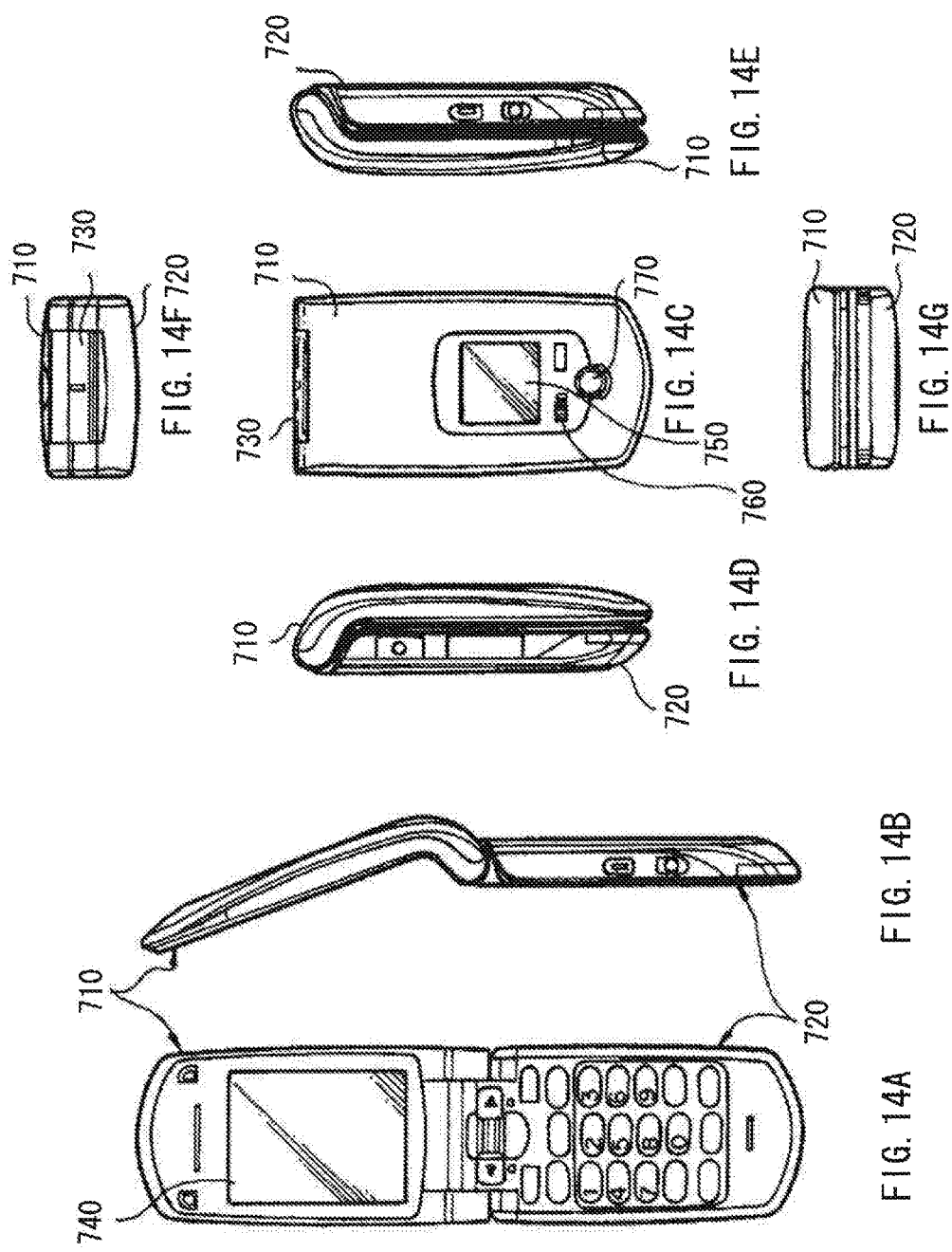
FIG. 14A is an elevation view of a fifth application example unclosed.
FIG. 14B is a side view thereof.
FIG. 14C is an elevation view of the fifth application example closed.
FIG. 14D is a left side view thereof.
FIG. 14E is a right side view thereof.
FIG. 14F is a top view thereof.
FIG. 14G is a bottom view thereof.
Figure 15:
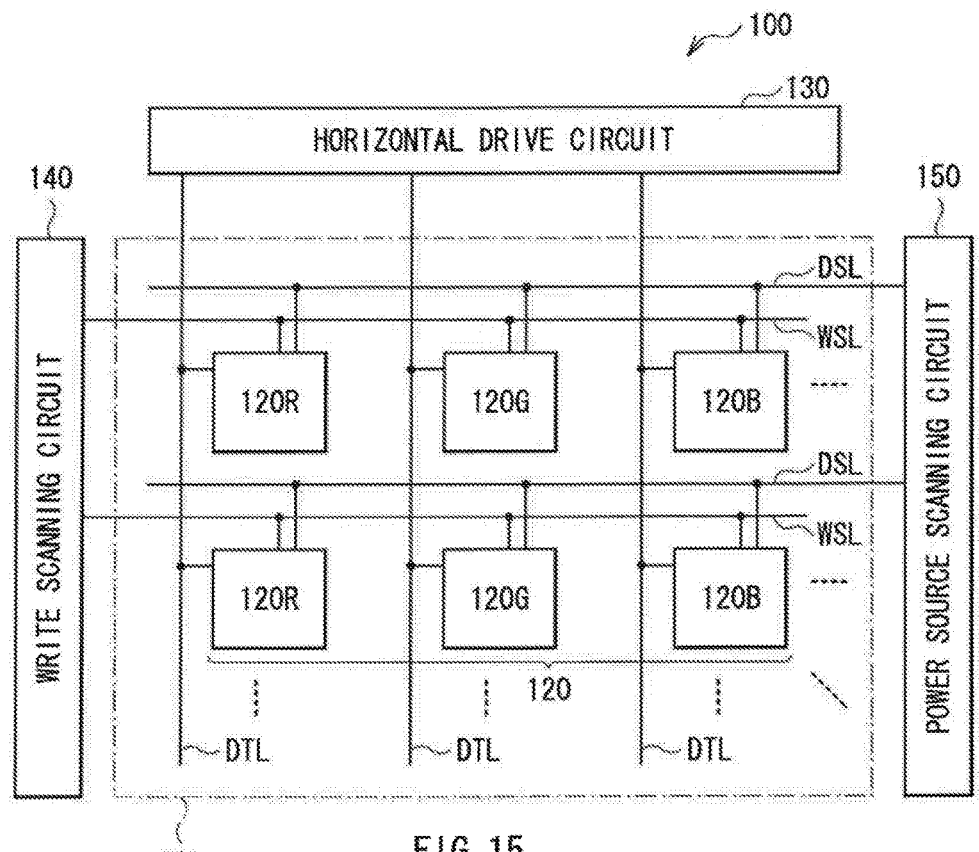
FIG. 15 is a schematic structural view of an existing display unit.
Figure 16:
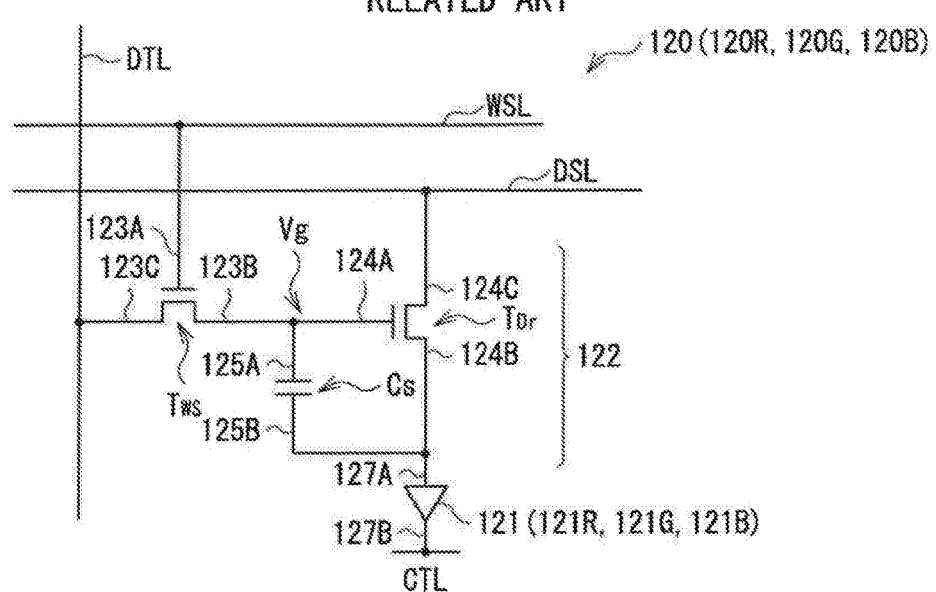
FIG. 16 is a circuit diagram of the pixel of FIG. 15.
Figure 17:
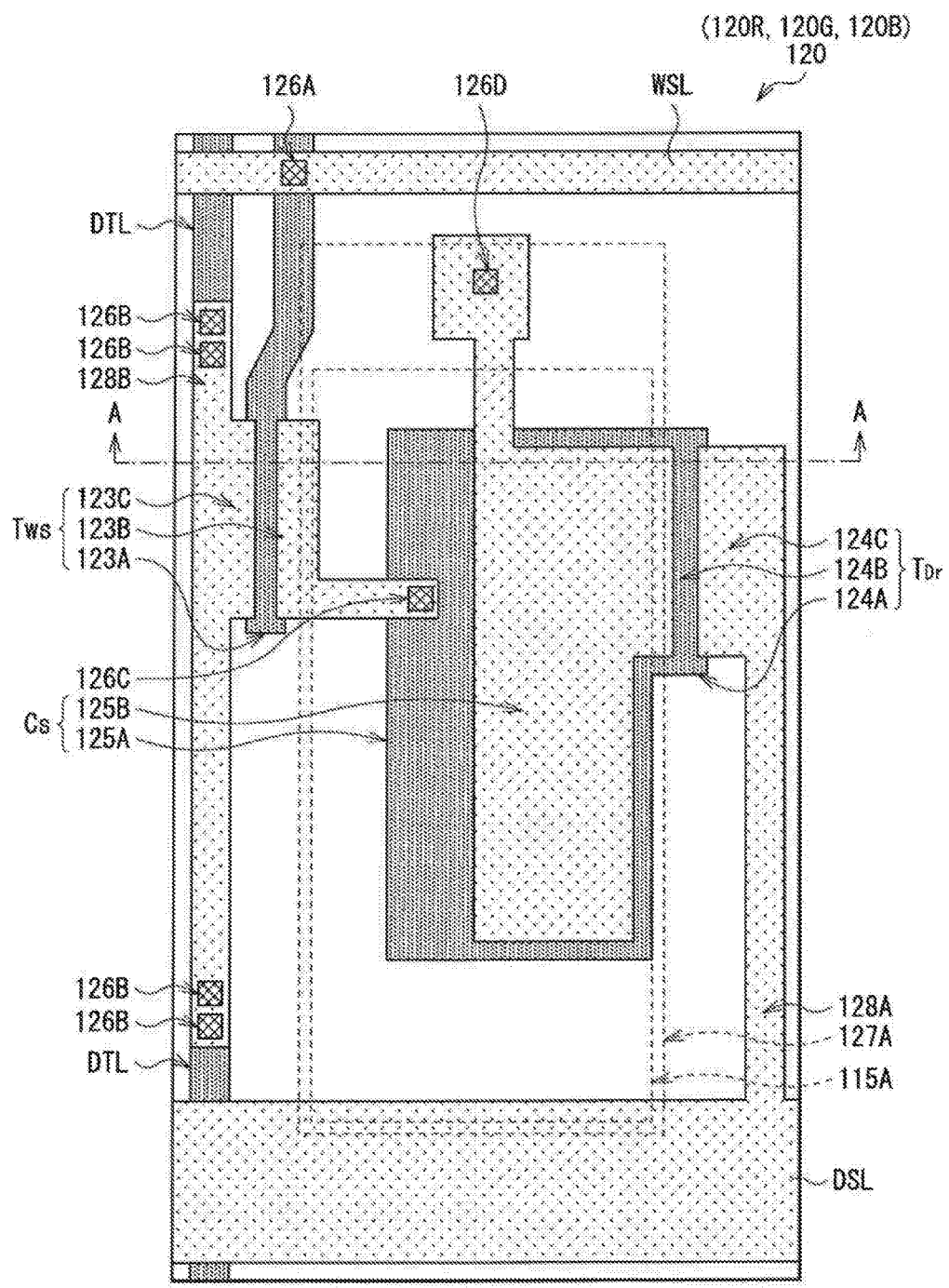
FIG. 17 is a layout diagram of the pixel of FIG. 15.

FIG. 13 illustrates an appearance of a video camera to which the display unit of the foregoing embodiment and the like is applied. The video camera has, for example, a main body 610, a lens for capturing an object 620 provided on the front side face of the main body 610, a start/stop switch in capturing 630, and a display section 640. The display section 640 is composed of the display unit according to the foregoing embodiment and the like.

Fifth Application Example

FIGS. 14A to 14G illustrate an appearance of a mobile phone to which the display unit of the foregoing embodiment and the like is applied. In the mobile phone, for example, an upper package 710 and a lower package 720 are jointed by a joint section (hinge section) 730. The mobile phone has a display 740, a sub-display 750, a picture light 760, and a camera 770. The display 740 or the sub-display 750 is composed of the display unit according to the foregoing embodiment and the like.

While the invention has been described with reference to the embodiment, the modified examples thereof, and the application examples, the invention is not limited to the foregoing embodiment and the like, and various modifications may be made.

For example, in the foregoing embodiment and the like, the description has been given of the case that the display unit is an active matrix type. However, the structure of the pixel circuit 13 for driving the active matrix is not limited to the case described in the foregoing embodiment and the like, and a capacity device or a transistor may be added to the pixel circuit 13 according to needs. In this case, according to the change of the pixel circuit 13, a necessary drive circuit may be added in addition to the horizontal drive circuit 22, the writing scanning circuit 23, and the power source scanning circuit 24 described above.

Further, in the foregoing embodiment and the like, driving of the horizontal drive circuit 22, the writing scanning circuit 23, and the power source scanning circuit 24 is controlled by the signal retention control circuit 21B. However, other circuit may control driving of the horizontal drive circuit 22, the writing scanning circuit 23, and the power source scanning circuit 24. Further, the horizontal drive circuit 22, the writing scanning circuit 23, and the power source scanning circuit 24 may be controlled by a hardware (circuit) or may be controlled by software (program).

Further, in the foregoing embodiment and the like, the description has been given of the case that the source and the drain of the transistor $T_{ws}$ and the source and the drain of the transistor $T_{Dr}$ are fixed. However, it is needless to say that according to the flowing direction of current, opposing relation between the source and the drain may be opposite to that of the foregoing explanation.

Further, in the foregoing embodiment and the like, the description has been given of the case that the transistors $T_{ws}$ and $T_{Dr}$ are formed from the n channel MOS type TFT. However, it is possible that at least one of the transistors $T_{ws}$ and $T_{Dr}$ is formed from a p channel MOS type TFT. In the case where the transistor $T_{Dr}$ is formed from the p channel MOS type TFT, the anode 35A of the organic EL device 12 becomes a cathode and the cathode 35B of the organic EL device 12 becomes an anode in the foregoing embodiment and the like. Further, in the foregoing embodiment and the like, the transistors $T_{ws}$ and $T_{Dr}$ are not necessarily the amorphous silicon type TFT or the micro silicon type TFT, but may be, for example, a low temperature polysilicon type TFT.

It should be understood by those skilled in the art that various modifications, combinations, sub-combinations and alternations may occur depending on design requirements and other factors insofar as they are within the scope of the appended claims or the equivalents thereof.

What is claimed is:

1. A display unit comprising:
   a first pixel including a first organic EL device configured to emit green light, and a first driving circuit configured to drive the first organic EL device;
   a second pixel including a second organic EL device configured to emit blue light, and a second driving circuit configured to drive the second organic EL device;
   a third pixel including a third organic EL device configured to emit red light, and a third driving circuit configured to drive the third organic EL device; and
   a control line connected to each of the first driving circuit, the second driving circuit, and the third driving circuit,
   wherein the second driving circuit is located between the first driving circuit and the third driving circuit,
   wherein the first driving circuit includes a first driving transistor, a first sampling transistor, and a first capacitor having a first electrode and a second electrode, the first capacitor being connected to a gate electrode of the first driving transistor, the first electrode is disposed over the second electrode,
   wherein the second driving circuit includes a second driving transistor, a second sampling transistor, and a second capacitor having a first electrode and a second electrode, the second capacitor being connected to a gate electrode of the second driving transistor, the first electrode is disposed over the second electrode,
   wherein the third driving circuit includes a third driving transistor, a third sampling transistor, and a third capacitor having a first electrode and a second electrode, the third capacitor being connected to a gate electrode of the third driving transistor, the first electrode is disposed over the second electrode,
   wherein the second organic EL device has a blue light emission area overlapping the second capacitor in a plan view,
   wherein a distance between a channel region of the first driving transistor and the blue light emission area is larger than a distance between the first electrode of the first capacitor and the blue light emission area, and
   wherein a distance between a channel region of the third driving transistor and the blue light emission is larger than a distance between the first electrode of the third capacitor and the blue light emission area.

2. The display unit according to claim 1, wherein the second organic EL device includes an anode electrode, a cathode electrode, and a light emitting layer disposed between the anode electrode and the cathode electrode.

3. The display unit according to claim 2, wherein the second organic EL device is configured to emit light through the cathode electrode.

4. The display unit according to claim 1,
   wherein the first organic EL device is formed upper than the channel region of the first driving transistor in a cross section,
   wherein the second organic EL device is formed upper than a channel region of the second driving transistor in a cross section, and
   wherein the third organic EL device is formed upper than the channel region of the third driving transistor in a cross section.

5. The display unit according to claim 4,
   wherein the first electrode of the first capacitor is formed between the first organic EL device and the channel region of the first driving transistor in a cross section,
   wherein the first electrode of the second capacitor is formed between the second organic EL device and the channel region of the second driving transistor in a cross section, and
   wherein the first electrode of the third capacitor is formed between the third organic EL device and the channel region of the third driving transistor in a cross section.

6. The display unit according to claim 1, wherein the second driving circuit is adjacent to the first driving circuit and the third driving circuit.

7. The display unit according to claim 1, wherein the blue light emission area is overlapping a channel region of the second driving transistor in a plan view.

8. The display unit according to claim 1, wherein the blue light emission area is not overlapping a channel region of the second sampling transistor in a plan view.

9. An electronic device comprising the display unit according to claim 1.

* * * * *